(12) United States Patent
Rich

(10) Patent No.: US 6,402,907 B1
(45) Date of Patent: Jun. 11, 2002

(54) METHOD OF FORMING A BARRIER LAYER

(75) Inventor: Paul Rich, Bristol (GB)

(73) Assignee: Trikon Holdings Limited, Newport (GB)

( * ) Notice: Subject to any disclaimer, the term of this patent is extended or adjusted under 35 U.S.C. 154(b) by 0 days.

(21) Appl. No.: 09/704,714

(22) Filed: Nov. 3, 2000

(30) Foreign Application Priority Data

Nov. 4, 1999 (GB) ............................................. 9926114

(51) Int. Cl.$^7$ ........................... C23C 14/34; H01L 21/44
(52) U.S. Cl. ............................ 204/192.17; 204/192.15; 438/582; 438/648; 438/656; 438/685
(58) Field of Search ....................... 204/192.17, 192.15; 438/582, 648, 656, 685

(56) References Cited

FOREIGN PATENT DOCUMENTS

| EP | 0 512 296 A1 | 11/1992 |
|---|---|---|
| GB | 2 314 681 | 1/1998 |

*Primary Examiner*—Rodney G. McDonald
(74) *Attorney, Agent, or Firm*—Volentine Francos, PLLC

(57) ABSTRACT

This invention relates to method of forming a barrier layer in a high aspect ratio recess in a dielectric layer on a semi-conductor wafer. The method includes performing the following steps in a single chamber without a vacuum break:

(a) sputtering, at a pressure of 1 millitorr or less, a titanium layer onto an exposed surface of the recess with the dielectric layer at a first distance from a sputter source or target (b) sputtering at a pressure in the range 1 millitorr to 5 millitorr a stochiometric titanium nitride layer onto the titanium layer with the dielectric at a second shorter distance from the sputter source or target

10 Claims, No Drawings

METHOD OF FORMING A BARRIER LAYER

This invention relates to a method of forming a barrier layer in a high aspect ratio recess in a dielectric layer on a semiconductor wafer.

It is well known to form barrier layers on semiconductor wafers to prevent the metalisation material, e.g. aluminium alloy or copper, spiking into the underlying dielectric layer or to prevent $WF_6$ (used in the deposition of tungsten) reacting with a titanium layer. Commonly these comprise a Ti seed layer and an overlying layer of stoichiometric TiN. Many methods have been proposed for forming such layers but they nearly all run into considerable difficulties when trying to form a satisfactory barrier layer deep in a high aspect ratio recess within the dielectric layer. As the features become smaller and smaller in semiconductor wafers, the aspect ratio of such recesses increases. Normally the sputtering distances for Ti and TiN are around 45 mm and sputtering typically takes place at a pressure around 5 millitorr. Due to problems of directionality, particularly when nitrogen is present to form TiN, the barrier layers formed in high aspect ratio holes are often not very successful.

The present invention consists in a method of forming a barrier layer in a high aspect ratio recess in a dielectric layer on a semiconductor wafer including performing the following steps in a single chamber without a vacuum break.

(a) sputtering, at a pressure of 1 millitorr or less, a titanium layer onto an exposed surface of the recess with the dielectric layer at a first distance from a sputter source or target (b) sputtering at a pressure in the range 1 millitorr to 5 millitorr a stoichiometric titanium nitride layer onto the titanium layer with the dielectric at a second shorter distance from the sputter source or target.

The first distance may lie in the range 400–450 mm and a distance of about 430 mm is particularly preferred. The second distance may lie in the range 225–275 mm, with a distance about 245 mm being particularly preferred.

The method may include mounting the wafer throughout on a support which is movable between the first and second distances.

The above proposal has a number of significant advantages. First by performing the titanium sputtering at a particularly low pressure, with an unusually large distance between the target and the dielectric layer, there is a significant increase in the directionality of the titanium molecules, both because there is a relatively small amount of scattering due to the low pressure, and because with the greater source to wafer distance, a significant proportion of material arriving at the tops of the recesses is directed normal or nearly normal to the base of the recess and is therefore likely to travel down its length and arrive at the base of the recess where the barrier is particularly required. Usually deposition on the main surface of the wafer is unnecessary and can be particularly disadvantageous.

What the applicants have therefore appreciated is that contrary to the usual approach, which is to increase the general sputter yield in the hope that a greater percentage will somehow get down the recess, they have located the wafer relative to the target and arranged the conditions so that they increase the likelihood of a layer being formed at the bottom of the recess, although they in general reduce the overall coating of the wafer.

In order to ensure that the TiN deposition does form stoichiometric TiN, there must be sufficient nitrogen present and so inevitably there must be an increase in pressure. The applicants have however realised that it is still possible to operate below the normal chamber pressure of 5 millitorr. Because of the presence of nitrogen, there will inevitably be greater scattering and in those circumstances a reduced source to wafer distance has been found to be necessary. However, the applicants have appreciated that a distance which is still far greater than usual can be utilised and thus they are able to increase the directionality of this deposition as well.

The invention can be particularly conveniently performed by using a moving platen or support for the wafer and the movement of the support can be computer controlled so as to be co-ordinated with the sputtering processes.

Thus it is proposed that a wafer, or batch of wafers, should be introduced in to a chamber onto a support which is Movable between the first and second distances relative to a sputter target. The chamber is evacuated to a base pressure and then back filled to 1 millitorr or below and the titanium sputtering takes place to form the seed layer. The period for this sequence can be determined either empirical calibration or on a process-by-process basis.

At the end of that step, the platen is moved to the second distance and an argon and nitrogen mix introduced to the chamber so that the chamber pressure lies between 1 and 5 millitorr. The TiN layer is then formed and the wafer or wafers removed from the chambers. It will be seen that this process is also particularly efficient from a throughput point of view and avoids any undesirable oxidation of the seed layer.

What is claimed is:

1. A method of forming a barrier layer in a high aspect ratio recess in a dielectric layer on a semiconductor wafer including performing the following steps in a single chamber without a vacuum break:

(a) sputtering, at a pressure of 1 millitorr or less, a titanium layer onto an exposed surface of the recess with the dielectric layer at a first distance from a sputter source or target;

(b) sputtering at a pressure in the range of 1 millitorr to 5 millitorr a stoichiometric titanium nitride layer onto the titanium layer with the dielectric layer at a second shorter distance from the sputter source or target.

2. A method as claimed in claim 1 wherein the first distance lies in the range 400 to 430 mm.

3. A method as claimed in claim 1 wherein the first distance is about 430 mm.

4. A method as claimed in claim 1 wherein the second shorter distance lies in the range 225 to 275 mm.

5. A method as claimed claim 1 wherein the second shorter distance is about 245 mm.

6. A method as claimed in claim 1 wherein the wafer is mounted throughout on a support which is movable between the first distance and the second shorter distance.

7. A method as claimed in claim 6 wherein the movement of the support is computer controlled.

8. A method as claimed in claim 1, wherein the pressure during sputtering of the titanium layer is less than the pressure during, sputtering of the titanium nitride layer.

9. A method as claimed in claim 2, wherein the second distance lies in the range 225 to 275 mm.

10. A method as claimed in claim 9, wherein the pressure during sputtering of the titanium layer is less than the pressure during sputtering of the titanium nitride layer.

* * * * *